United States Patent [19]

Schreck et al.

[11] Patent Number: 5,287,315

[45] Date of Patent: Feb. 15, 1994

[54] SKEWED REFERENCE TO IMPROVE ONES AND ZEROS IN EPROM ARRAYS

[75] Inventors: John F. Schreck, Houston; Debra J. Dolby, Sugarland; David J. McElroy, Lubbock; Eddie H. Breashears, Lubbock; John H. MacPeak, Lubbock, all of Tex.

[73] Assignee: Texas Instruments Incorporated, Dallas, Tex.

[21] Appl. No.: 57,435

[22] Filed: May 7, 1993

Related U.S. Application Data

[63] Continuation of Ser. No. 648,105, Jan. 31, 1991, abandoned.

[51] Int. Cl.⁵ .................. G11C 7/02; G11C 11/34
[52] U.S. Cl. .................. 365/210; 365/185; 365/189.09
[58] Field of Search .......... 365/185, 189.01, 190, 365/189.09, 210

[56] References Cited

U.S. PATENT DOCUMENTS

| | | | |
|---|---|---|---|
| 4,348,596 | 9/1982 | Atherton et al. | 365/210 |
| 4,377,857 | 3/1983 | Tickle | 365/185 |
| 4,434,479 | 2/1984 | Chen et al. | 365/210 |
| 4,494,219 | 1/1985 | Tanaka et al. | 365/185 |
| 4,636,979 | 1/1987 | Donoghue | 365/210 |
| 4,670,675 | 6/1987 | Donoghue | 365/189.09 |
| 4,672,409 | 6/1987 | Takei et al. | 365/185 |
| 4,722,075 | 1/1988 | Kaszubinski et al. | 365/226 |
| 4,811,291 | 3/1989 | de Ferron | 365/185 |
| 4,855,956 | 8/1989 | Urai | 365/210 |
| 4,868,790 | 9/1989 | Wilmoth et al. | 365/210 |
| 4,982,364 | 1/1991 | Iwahashi | 365/185 |
| 4,982,372 | 1/1991 | Matsuo | 365/185 |

Primary Examiner—Eugene R. LaRoche
Assistant Examiner—Michael C. Kessell
Attorney, Agent, or Firm—Theodore D. Lindgren; Leo N. Heiting; Richard L. Donaldson

[57] ABSTRACT

A structure and method for improving the sense margin of nonvolatile memories is disclosed. An improvement to the sense margin of nonvolatile memories is accomplished by improving the margin both for "ones" at low control gate voltage Vcc and for "zeros" at high control gate voltage Vcc. Improvement in sensing at low control gate voltages Vcc is accomplished by skewing the sense amplifier response characteristics by forming the channel length of the reference memory cell to have a longer channel length than the memory cells of the array.

6 Claims, 6 Drawing Sheets

| | | | ADDRESS INPUT | | | |
|---|---|---|---|---|---|---|
| | | | PRE DECODER | | | |
| | | | PROGRAM PATH | | | |
| REDUNDANT ROWS | | REDUNDANT COLUMNS | REDUNDANT ROWS | REDUNDANT ROWS | | REDUNDANT ROWS |
| 512x512 MEMORY CELL ARRAY | WORDLINE DECODER AND DRIVERS | | 512x512 MEMORY CELL ARRAY | 512x512 MEMORY CELL ARRAY | WORDLINE DECODER AND DRIVERS | 512x512 MEMORY CELL ARRAY |
| COLUMN/ SEGMENT PASS GATES | SEGMENT DECODER | COLUMN/ SEGMENT PASS GATES | | COLUMN/ SEGMENT PASS GATES | SEGMENT DECODER | COLUMN/ SEGMENT PASS GATES |
| 512x512 MEMORY CELL ARRAY | WORDLINE DECODER AND DRIVERS | REDUNDANT COLUMNS | 512x512 MEMORY CELL ARRAY | 512x512 MEMORY CELL ARRAY | WORDLINE DECODER AND DRIVERS | 512x512 MEMORY CELL ARRAY |
| 512x512 MEMORY CELL ARRAY | | REDUNDANT COLUMNS | 512x512 MEMORY CELL ARRAY | 512x512 MEMORY CELL ARRAY | | 512x512 MEMORY CELL ARRAY |
| COLUMN/ SEGMENT PASS GATES | SEGMENT DECODER | COLUMN/ SEGMENT PASS GATES | | COLUMN/ SEGMENT PASS GATES | SEGMENT DECODER | COLUMN/ SEGMENT PASS GATES |
| 512x512 MEMORY CELL ARRAY | WORDLINE DECODER AND DRIVERS | REDUNDANT COLUMNS | 512x512 MEMORY CELL ARRAY | 512x512 MEMORY CELL ARRAY | WORDLINE DECODER AND DRIVERS | 512x512 MEMORY CELL ARRAY |
| VIRTUAL GROUND DECODER | COLUMN DECODER | VIRTUAL GROUND DECODER | | VIRTUAL GROUND DECODER | COLUMN DECODER | VIRTUAL GROUND DECODER |
| SENSE AMPS | | SENSE AMPS | | SENSE AMPS | | SENSE AMPS |
| | | | DATA INPUT/OUTPUT | | | |

FIG. 1

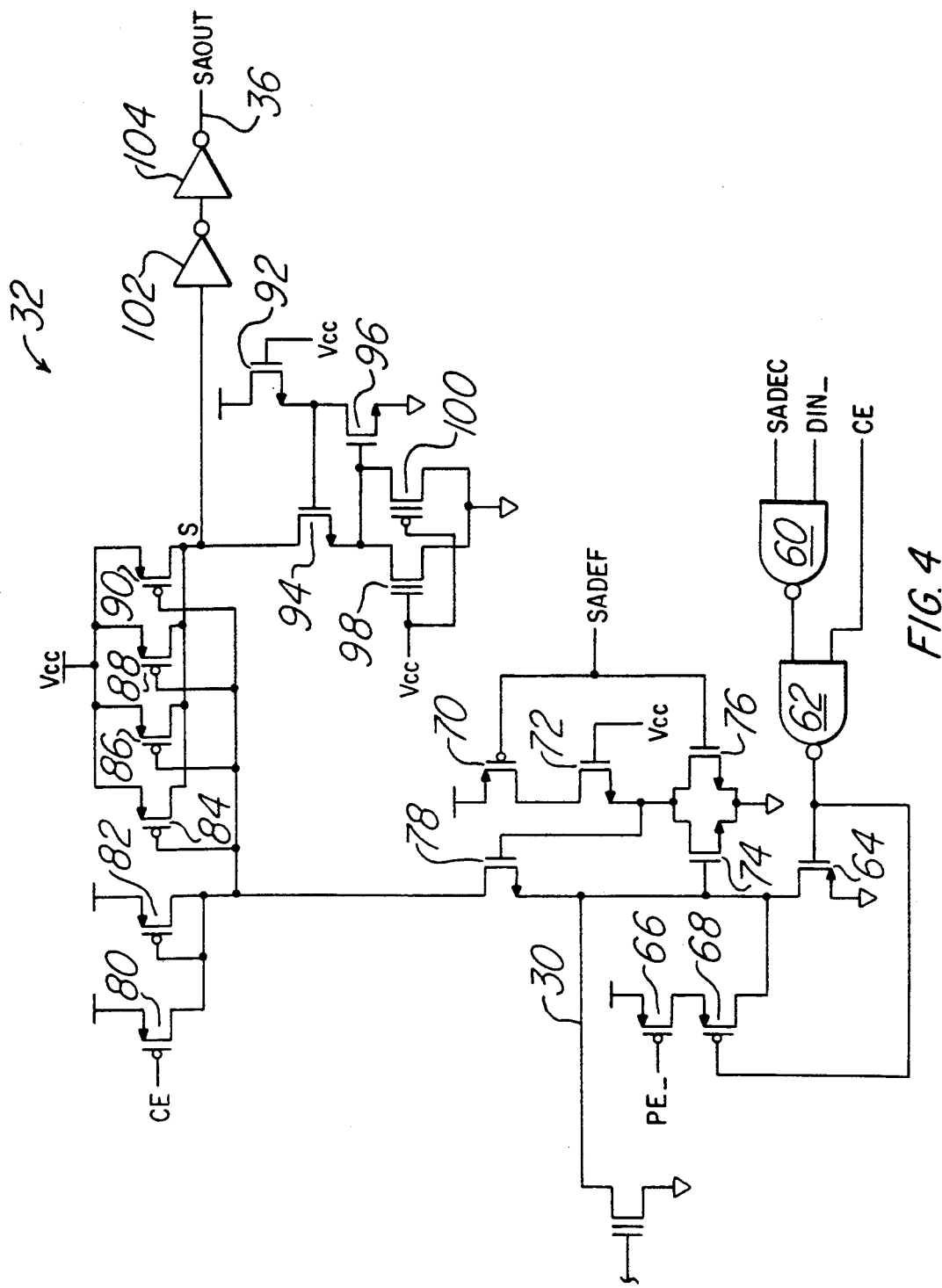

SKEWED REFERENCE TO IMPROVE ONES AND ZEROS IN EPROM ARRAYS

This application is a continuation of application Ser. No. 07/648,105, filed Jan. 31, 1991, abandoned.

FIELD OF THE INVENTION

This invention relates to a structure and method for improving the sense margin of nonvolatile memories. In particular, this invention relates to skewing of the characteristics of a sense amplifier by forming the reference memory cell with a longer channel length.

BACKGROUND OF THE INVENTION

In EPROM's, a "one" is defined as the state in which the floating gate memory cell conducts at a low threshold voltage Vt, that is, with little or no voltage on the control gate. The source-drain path of a floating gate memory cell conducts at a relatively low threshold voltage Vt if the cell is "erased", that is, there are no excess electrons in the floating gate. A "zero" is the state in which the threshold voltage Vt of the memory cell is raised (programmed) such that the cell does not conduct under normal operating conditions. The source-drain path conducts at a relatively high threshold voltage Vt if the cell is "programmed", that is, there are a sufficient number of electrons trapped on the floating gate to deplete the number of conductors in the source-drain path.

The margin between the threshold voltages Vt of erased memory cells and of programmed memory cells must be such that erased cells have threshold voltages Vt above a reference value and programmed cells have threshold voltages Vt below a reference accomplished by comparing the selected memory cell to a reference cell in such a way that the reference cell defines a condition, current or voltage, that resides between the "one" and "zero" state of the selected bit. Both the reference cell and the selected cell have the same voltage Vcc applied to their control gates during read operation. The comparison to determine whether a "one" or a "zero" is stored on the selected cell is performed by a sense amplifier.

One previous method for improving the sensing capability of sense amplifiers includes changing the width of the load resistor/transistor in the sense amplifier. In the previous method, the difference between the current in the reference memory cell and in the selected memory cell is the same throughout the range from low control gate voltage Vcc to high control gate voltage Vcc.

What is needed is a method of improving the sensing capability of the sense amplifier circuit at low values of control gate voltage Vcc without significantly degrading the sensing capability at high values of control gate voltage Vcc.

SUMMARY OF THE INVENTION

Generally, and in one form of the invention, improvement to the sense margin of nonvolatile memories is accomplished by improving the margin both for ones at low control gate voltage Vcc and for zeros at high control gate voltage Vcc. Margin improvement occurs if the reduction in drain-source current of the reference cell, as voltage Vcc is lowered, occurs at a faster rate than the reduction in drain-source current of the selected cell.

Improvement in sensing at low control gate voltages Vcc is accomplished by skewing the sense amplifier response characteristics by forming the channel length of the reference memory cell to have a longer channel length than the memory cells of the array. The longer channel length causes the reference memory cell to conduct much less current than the selected memory cell at low values of control gate voltage Vcc. However, the difference in currents caused by the longer length ratio (different width/length ratio) is much less at high Vcc sensing. Because the threshold voltage Vt changes with channel length, the sense amplifier response characteristic is skewed.

Again, sense-amplifier reading of the state of a selected memory cell is accomplished by comparing the selected cell to a reference cell in such a way that the reference cell defines a condition, current or voltage, that resides between the "one" and "zero" state of the selected bit. To increase further the margin between threshold voltages Vt of programmed and erased cells, the control gate of the reference cell is kept at the same potential as the control gate of the selected memory cell. As the control gate potential of both cells increases, the current of both the reference and memory cells increases. As the gate potential is elevated above a selected cell's programmed threshold voltage Vt such that the cell is conducting, the reference cell's current also increases, so that the gate potential must be raised well beyond the selected cell's threshold voltage before the cell is detected as erased.

BRIEF DESCRIPTION OF THE DRAWINGS

The novel features believed characteristic of the invention are set forth in the appended claims. The invention itself, however, as well as other features and advantages thereof, will be best understood by reference to the detailed description which follows, read in conjunction with the accompanying drawings, wherein: FIG. 1 is an electrical diagram in block form of a semiconductor memory device of the floating gate EPROM type using features of the invention.

FIG. 4 is an electrical schematic diagram of a sense amplifier/program circuit representative of each of the sense amplifier/program circuits in FIG. 3a.

DETAILED DESCRIPTION OF THE PREFERRED EMBODIMENT

Referring to FIG. 1, a memory system using features of the invention is shown. Although the invention may be used in memory devices of various types and sizes, the example shown here is an integrated circuit layout for a nominal four megabit EPROM. The layout, in which dimensional proportions are not those of actual manufacture, illustrates sixteen 512 by 512 memory sub-arrays with redundant rows and columns used to replace rows and columns having defective cells. Peripheral circuitry, including row decoders, column decoders, virtual-ground decoders, wordline drivers, and column/segment pass gates, functions to connect reading and programming voltages to the rows and columns of cells in response to address inputs routed through a pre-decoder and program path. Data are written into the memory arrays during programming operations. During reading operations, data from the memory arrays are routed through sense amplifiers to the output.

Figure 2:
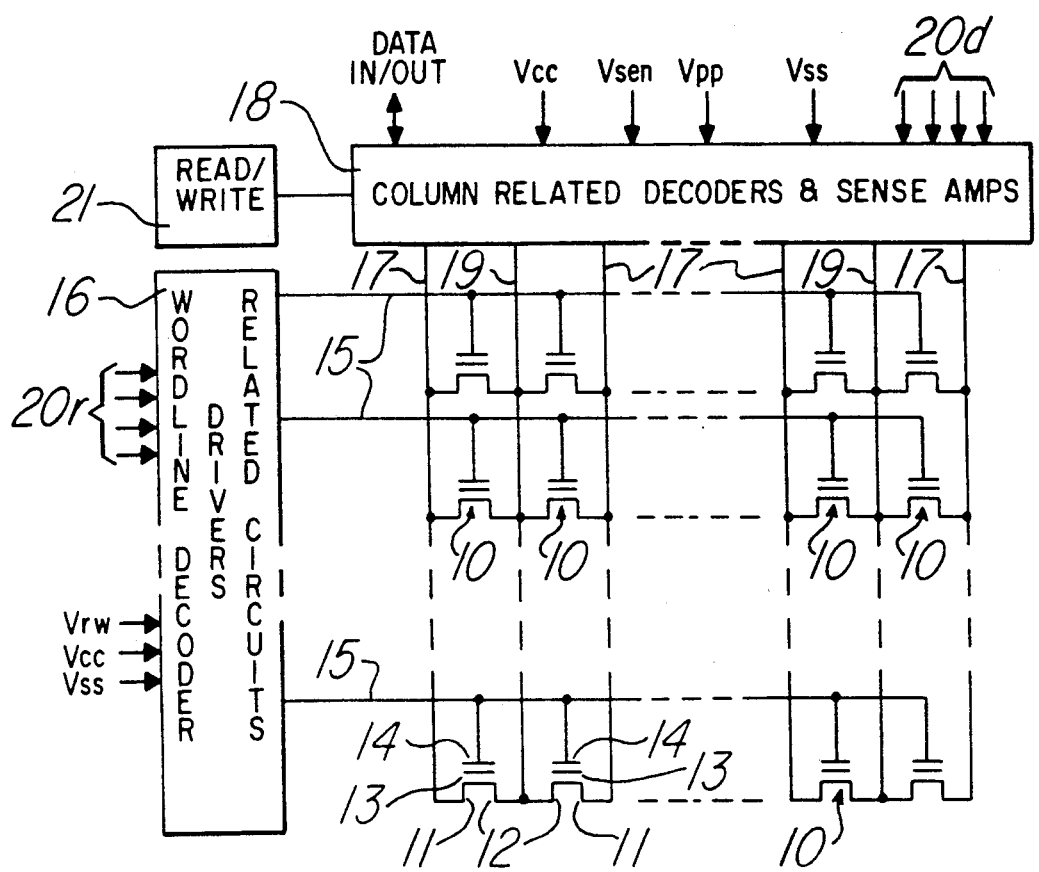
FIG. 2 is an enlarged sectional view of one of the memory cells in the array of FIG. 1.

Referring to FIG. 2, an example array of memory cells, which is a part of a memory chip such as that illustrated in FIG. 1, is shown. Each cell 10 is a floating gate transistor having a source 11, a drain 12, a floating gate 13 and a control gate 14. Each of the control gates 14 in a row of cells 10 is connected to a wordline 15, and each of the wordlines 15 is connected to a row decoder circuit 16. Each of the sources 11 in a column of cells 10 is connected to a source-column line 17 (which may be a virtual ground line), and each of the source-column lines 17 is connected to a column decoder circuit 18. Each of the drains 12 in a column of cells 10 is connected to a drain-column line 19, and each of the drain-column lines 19 is connected to the column decoder circuit 18.

In a write or program mode, row decoder circuit 16, in response to wordline address signals $A_n+1-A_x$ and to signals from read/write control circuit 8, places a first preselected programming voltage Vpp (approximately +12.5 volts) on a selected wordline 15, including a control gate 14 of a selected memory cell 10. Column decoder circuit 18, in response to bitline address signals $A_0-A_n$ and to signals from read/write control circuit 8, places a second programming voltage Vrw (which may be Vpp reduces through an impedance to approximately +5 to +10 volts) on a selected source-column line 17 and, therefore, the source region 11 of the selected cell 10. Column decoder circuit 18 also connects a selected drain-column line 19 to reference potential Vss. Deselected source-column lines 17 and deselected drain-column lines 19 are floated. These programming voltages create a high current (drain 12 to source 11) condition in the channel of the selected memory cell 10, resulting in the generation near the drain-channel junction of channel-hot electrons and avalanche-breakdown electrons that are injected across the channel oxide to the floating gate 13 of the selected cell 10. The programming time is selected to be sufficiently long to program the floating gate 13 with a negative program charge of approximately −2 volts to −6 volts with respect to the channel region. The injected electrons and negative program charge in turn render the source-drain path under the floating gate 13 of the selected cell 10 nonconductive, a state which is read as a "zero" bit. Deselected cells 10 have source-drain paths under the floating gate 13 that remain conductive, and those cells 10 are read as "one" bits.

Erasing of cells may be accomplished, for example, by ultraviolet radiation.

In the read mode, row decoder circuit 16, in response to wordline address signals $A_n+1-A_x$ and to signals from read/write control circuit 8, applies a preselected positive voltage Vcc (approximately +3 volts to +5 volts) to the selected wordline 15 and thus to the selected control gate 14, and applies a low voltage (ground or Vss) to deselected wordlines 15. The column decoder circuit 18, in response to column address signals $A_0-A_n$ and to signals from read/write control circuit 8, applies a positive voltage Vsen (approximately +1 volt to +1.5 volts) to the selected drain-column line 19. Column decoder circuit 18 also connects all of the source-column lines 17 to ground or reference potential Vss except for the source-column line 17 sharing the same drain-column line connected to the cell 10 that is being read. That source-column line 17 is driven to the same voltage level as the selected draincolumn line 19.

As is well known, the source 11 regions and the drain 12 regions of the memory cells 10 may be interchanged for the various modes of operation. Voltages applied to the source 11 and drain 12 regions in the read example above are interchangeable. Therefore, the terms "source" and "drain" as used herein are interchangeable for each mode of operation.

Figure 3A:
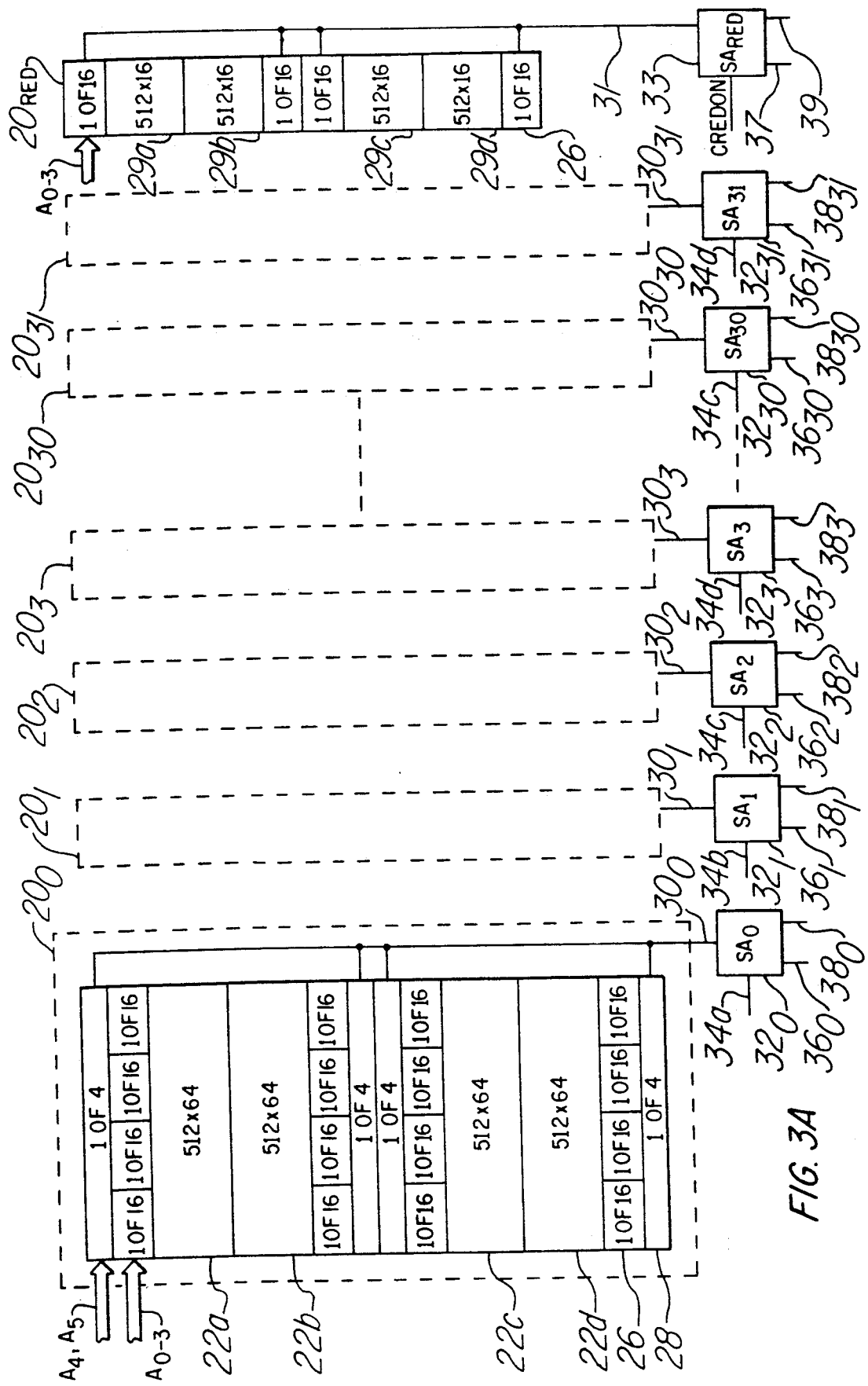
FIGS. 3a-3b are electrical diagrams in block form of circuitry for implementing column redundancy in the EPROM of FIG. 1.
Figure 3B:
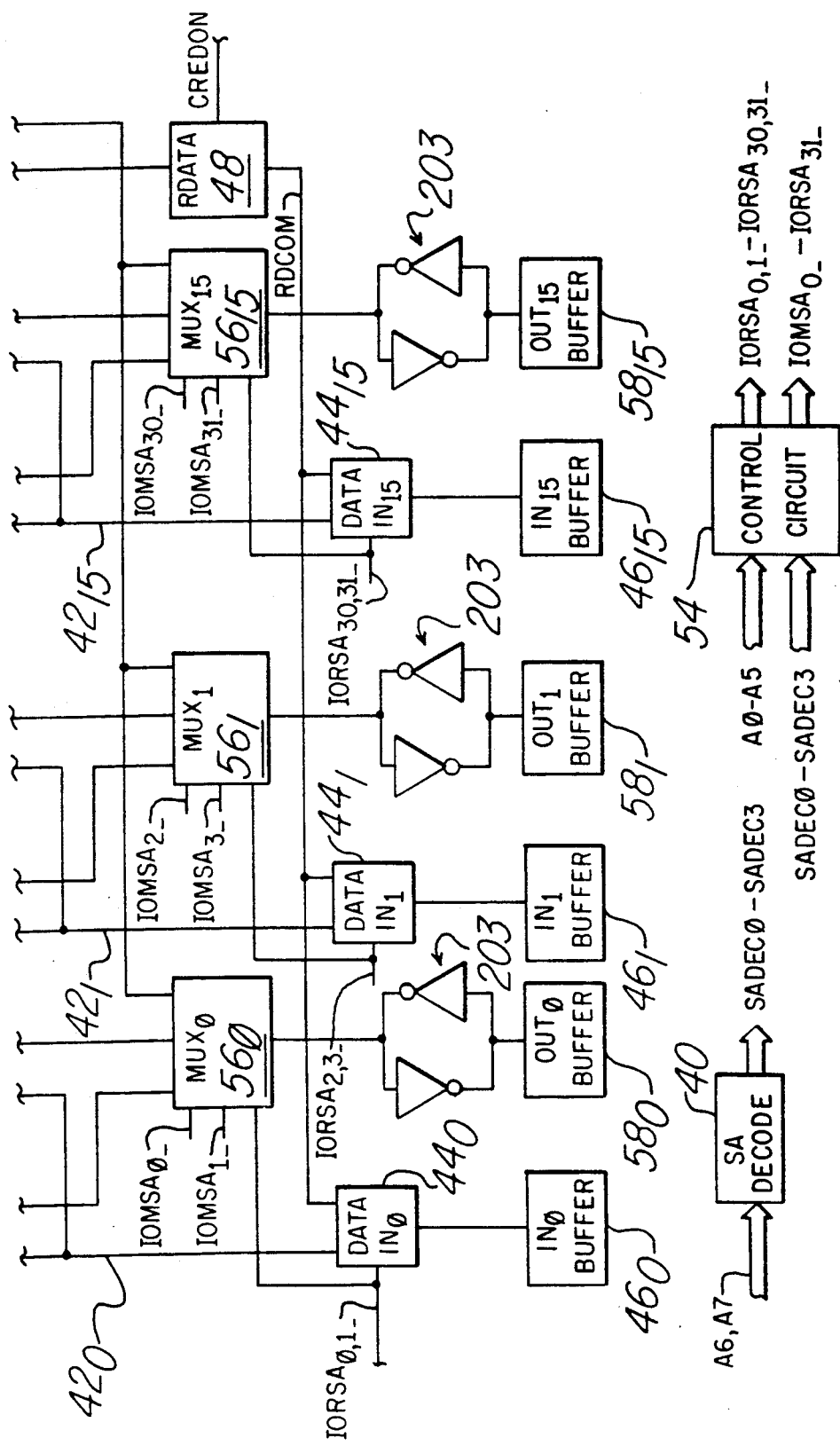

FIGS. 3a and 3b show in block diagram form the circuitry for implementing column redundancy in the EPROM of FIG. 1. Although row decoding circuitry is not shown for ease of understanding, it is understood that the row decoding circuitry would select a single one of the 2,048 wordlines in each column of four 512 row by 512 column subarrays in response to row address signals $A_8-A_{18}$.

As seen in FIG. 3a, each of the four columns of four 512 row by 512 column memory cell subarrays is divided into eight sections 20, for a total of 32 sections $20_0-20_{31}$. Each of the sections $20_0-20_{31}$ includes four 512 row by 64 column memory cell subarray portions $22a-22d$. For each of the portions $22a-22d$, 1 of 64 column decoding is performed using four 1 of 16 decoders 26 and a 1 of 4 decoder 28. Each decoder 26 is connected to 16 of the 64 columns of memory cells in an associated portion and selects one of the 16 columns in response to address signals $A_0-A_3$. Each decoder 28 is connected to the outputs of the four 1 of 16 decoders 26 and in response to address signals $A_4$, $A_5$ couples a selected one of the outputs of decoders 26 to that one of lines $30_0-30_{31}$.

A section $20_{RED}$ of redundant columns of memory cells is also provided. Redundant section $20_{RED}$ includes four 512 row by 16 column memory cell subarray portions $29a-29d$. Each memory cell subarray portion $29a-29d$ is connected to a 1 of 16 decoder 26 which couples a selected one of the 16 source-column lines to line 31 in response to address signals $A_0-A_3$. Each redundant column in section $20_{RED}$ is capable of being mapped or coupled to any of the pairs of input and output buffers ($46_0$ and $58_0$, $46_1$ and $58_1$, . . . , $46_{15}$ and $58_{15}$) and is available to replace any one of the 128 columns in sections $20_0-20_{31}$ having the same $A_0-A_3$ address.

Each of the lines $30_0-30_{31}$ is connected to an associated one of sense amplifier/program circuits $32_0-32_{31}$. Sense amplifier/program circuits $32_0-32_{31}$ receive control signals SADEC0-SADEC3 from sense amplifier decoder 40 over lines $34a-34d$. Every fifth one of the sense amplifier program circuits 32 beginning with $32_0$ (i.e., $32_0$, $32_4$, $32_8$, . . . $32_{29}$) receives a control signal SADEC1 over line $34b$. Every fifth one of the sense amplifier/program circuits beginning with $32_2$ (i.e., $32_2$, $32_6$, $32_{10}$, . . . , $32_{30}$) receives a control signal SADEC2 over line $34c$. Every fifth one of the sense amplifier/program circuits beginning with $32_3$ (i.e., $32_3$, $32_7$, $32_{11}$, . . . , $32_{31}$) receives a control signal SADEC3 over line $34d$. Sense amplifier/program circuits $32_0-32_{31}$ are enabled in response to control signal SADEC0-SADEC3 having a logic "1" level to couple data received on input lines $36_0-36_{31}$ to lines $30_0-30_{31}$ and disabled in response to control signals SADEC0-SADEC3 having a logic "0" level to prevent coupling of data received on input lines $36_0-36_{31}$ to lines $30_0-30_{31}$.

Control signals SADEC0–SADEC3 are produced by sense amplifier decoder 40 in response to address signal $A_6$ when the EPROM is in a by 16 (16 bit) configuration or in response to address signals $A_6$, $A_7$ when the EPROM is in a by 8 (8 bit) configuration. When operating in a by 16 configuration, one of control signals SADEC0 and SADEC1 and one of control signals SADEC2 and SADEC3 will have a logic "1" level to enable a single one of each adjacent pair of sense amplifier program circuits $32_0$ and $32_1$, $32_2$ and $32_3$, ..., and $32_{30}$ and $32_{31}$. For example, when address signal $A_6$ has a logic "0" level, control signals SADEC0 and SADEC2 have logic "1" levels enabling sense amplifier/program circuits $32_0$, $32_2$, ..., $32_{30}$ and control signals SADEC1 and SADEC3 have logic "0" levels. When address signal $A_6$ has a logic "1" level enabling sense amplifier/program circuits $32_1$, $32_3$, ..., $32_{31}$ and control signals SADEC0 and SADEC2 have logic "0" levels.

When operating in a by 8 configuration, only one of control signals SADEC0–SADEC3 will be a logic "1" level to enable a single one of each of four adjacent sense amplifier/program circuits $32_0$–$32_3$, $32_4$–$32_7$, ..., and $32_{28}$–$32_{31}$. For example, if address signals $A_6$ and $A_7$ have logic "0" levels, control signal SADEC0 has a logic "1" level and control signals SADEC1–SADEC3 have logic "0" levels. When address signals $A_6$ and $A_7$ have logic "1" and "0" levels, respectively, control signal SADEC1 has a logic "1" level and control signals SADEC0, SADEC2, and SADEC3 have logic "0" levels. When address signals $A_6$ and $A_7$ have logic "1" levels, control signal SADEC3 has a logic "1" level and control signals SADEC0–SADEC2 have logic "0" levels.

Line 31 is connected to redundant sense amplifier/program circuit 33 which receives a control signal CREDON from control circuit 54. Redundant sense amplifier/program circuit 33 is enabled in response to control signal CREDON having a logic "1" level to couple data received on input line 37 to line 31 and disabled in response to control signal CREDON having a logic "0" level to prevent coupling of data received on input line 37 to line 31.

Data input lines $36_0$–$36_{31}$ of sense amplifier/program circuits $32_0$–$32_{31}$ are connected in pairs to lines $42_0$–$42_{15}$ which in turn are connected to data-in circuits $44_0$–$44_{15}$, respectively. Each of data-in circuits $44_0$–$44_{15}$ is also connected to line 50. In the program mode, each data-in circuit $44_0$–$44_{15}$ selectively couples input data from input buffers $46_0$–$46_{15}$ to either line 42 in response to control signals IORSA0,1_–IORSA30,31_ received from control circuit 54 having logic "0" levels or to line 50 in response to control signals IORSA0,1_–IORSA30,31_ having logic "1" levels.

Redundant data-in circuit 48 selectively couples data received on line 50 to data input line 37 of redundant sense amplifier/program circuit 33 in response to control signal CREDON having a logic "0" level.

Data output lines $38_0$–$38_{31}$ of sense amplifier/program circuits $32_0$–$32_{31}$ are connected in pairs to output multiplexers $56_0$–$56_{15}$. Data output line 39 of redundant sense amplifier/program circuit 33 is also connected to each one of multiplexers $56_0$–$56_{15}$. The outputs of multiplexers $56_0$–$56_{15}$ are connected to output buffers $58_0$–$58_{15}$, respectively.

Multiplexers $56_0$–$56_{15}$ receive control signals IORSA0,1_–IORSA30,31_, respectively, from control circuit 54. Each multiplexer 56 couples redundant sense amplifier/program circuit 33 to output buffer 58 in response to a control signal IORSA_ having a logic "0" level and disconnects redundant sense amplifier/program circuit 33 from output buffer 58 in response to a control signal IORSA_ having a logic "0" level.

Multiplexers $56_0$–$56_{15}$ also receive pairs of control signals IOMSA0_ and IOMSA1_, IOMSA2_ and IOMSA3_, ..., IOMSA30_ and IOMSA31_, respectively, from control circuit 54. Control signals IOMSA0_–IOMSA31_ are associated with sense amplifier/program circuits $32_0$–$32_{31}$, respectively. Each multiplexer 56 couples a sense amplifier/program circuit 32 to output buffer 58 in response to the control signal IOMSA_ associated with that sense amplifier/program circuit 32 having a logic "0" level and disconnects that sense amplifier/program circuit 32 from output buffer 58 in response to that control signal IOMSA_ having a logic "1" level.

To implement column redundancy, columns containing defective cells or bits are first identified by probing the memory. Control circuit 54 is then programmed to store information identifying which of the 2,048 columns in sections $20_0$–$20_{31}$ contains defective cells. Control circuit 54 receives column address signals $A_0$–$A_5$ and decoded address signals SADEC0–SADEC3, which correspond to column address signal $A_6$ in the by 16 configuration and to column address signals $A_6$, $A_7$ in the by 8 configuration, and in response produces control signals CREDON, IORSA0,1_–IORSA30,31_, and IOMSA0_–IOMSA31_.

When received address signals $A_0$–$A_5$ and decoded address signals SADEC0–SADEC3 correspond to non-defective columns at all bit positions, signal CREDON has a logic "0" level and signals IORSA0,1_–IORSA30,31_ have logic "1" levels. In the by 8 configuration, those 8 of the 32 signals IOMSA0_–IOMSA31_ which are associated with enabled sense amplifier/program circuits 32 have logic "1" levels (e.g., signals IOMSA0_, IOMSA4_, IOMSA8, ..., IOMSA28) and the remaining signals have logic "0" levels. In the by 16 configuration, those 16 of the 32 signals IOMSA0_, IOMSA2_, IOMSA4, ..., IOMSA30) and the remaining signals have logic "0" levels.

In response to signal CREDON having a logic "0" level, redundant data-in circuit 48 and redundant sense amplifier/program circuit 33 are disabled to prevent data in any input buffer $46_0$–$46_{15}$ from being programmed into a cell in the redundant column in redundant section $20_{RED}$ selected by a decoder 26 in response to address signals $A_0$–$A_3$. In response to signals IORSA0,1_–IORSA30,31_ having logic "1" levels, data-in circuits $44_0$–$44_{15}$ are also disabled to prevent the coupling of input data from input buffers $46_0$–$46_{15}$ to line 50 thus providing additional assurance that data will not be programmed into the selected redundant column.

In addition, multiplexers $56_0$–$56_{15}$ respond to signals IORSA0,1_–IORSA30,31_ having a logic "1" level to prevent data read from the redundant column by redundant sense amplifier/program circuit 33 from being coupled to output buffers $58_0$–$58_{15}$. Multiplexers $56_0$–$56_{15}$ respond to those signals IOMSA0_–IOMSA31_ having a logic "0" level to couple data read from an associated sense amplifier/program circuit 32 to output buffers $58_0$–$58_{15}$. Multiplexers $56_0$–$56_{15}$ respond to those signals IOMSA0_–IOMSA31_ having a logic "1" level to prevent data read from an associated sense amplifier/program circuit 32 from being coupled to output buffers $58_0$–$58_{15}$.

When received address signals A₀-A₅ and decoded address signals SADEC0-SADEC3 correspond to a defective column, control circuit 54 produces a control signal CREDON having a logic "1" level. In addition control circuit 54 produces for the single multiplexer 56 associated with the defective column a control signal IORSA_ having a logic "0" level and control signals IOMSA_ having a logic "1" level. For the remaining multiplexers 56, all of which contain nondefective columns at the address identified by address signals A₀-A₅ and decoded address signal SADEC0-SADEC3, control circuit 54 produces control signals IORSA_ having a logic "0" level and control signals IOMSA_ having logic levels determined in the same manner as when a nondefective address is received.

The data in circuit 44 at the bit position having the defective column, in response to control signal IORSA_ having logic "0" level, couples data received from an input buffer 46 to line 50. Redundant data-in circuit 48 and redundant sense amplifier/program circuit 33 are enabled by the CREDON signal having a logic "1" level to couple line 50 to line 31 to permit the selected cell in the redundant column to be programmed in accordance with the input data.

The multiplexer 56 associated with the defective column, in response to control signal IORSA_ having a logic "0" level and signals IOMSA_ having a logic "0" level, couples the data read by redundant sense amplifier/program circuit 33 to output buffer 58. The remaining multiplexers 56 couple output lines 38 of those sense amplifier/program circuits 32 which are associated with control signals IOMSA_ having a logic "0" level to output buffers 58.

FIG. 4 is an electrical schematic diagram of a sense amplifier/program circuit 32 representative of each of the sense amplifier/program circuits 32₀-32₃₁. In the program mode, a chip enable signal CE having a logic "1" level is applied to NAND gate 62, a sense amplifier defeat signal SADEF having a logic "0" level is applied to the gate of transistors 70 and 76, and a program enable complement signal PE_ having a logic "0" level is applied to the gate of transistor 66. The logic "0" level of signal SADEF disables a bias circuit made up of transistors 70, 72, 74, 76, and 78 which normally biases line 30 in the read mode. If the sense amplifier decode signal SADEC, which is one of signals SADEC0-SADEC3 produced by sense amplifier 40, received by NAND gate 60 is a logic "1" level than the selected memory cell coupled to line 30 will be programmed in response to the data in complement signal DIN_ received from data in circuit 44.

If signal DIN_ has a logic "0" level, NAND gate 62 will supply a logic "0" level signal to the gates of transistors 64 and 68 to turn them off and on, respectively. Line 30 will then be coupled to the positive voltage source Vcc through transistor 68 and transistor 70, which is on in response to signal PE_. Line 30 applies a positive voltage to the source of the selected memory cell which prevents the floating gate from being programmed to store a "0" value despite programming voltages being applied to the drain and gate of the memory cell. This positive voltage is also applied to column programming circuitry in such a way that the programming circuitry does not apply programming voltages to the drain of the selected memory cell. The memory cell thus remains at a "0" value.

If signal DIN_ has a logic "1" level, NAND gate will supply a logic "1" level signal to the gates of transistors 64 and 68 to turn them on and off, respectively. Line 30 will then be coupled to ground through transistor 64. With the source of the selected memory cell coupled to ground by way of line 30, the gate applied to line 30 affects the column programming circuitry such that programming voltage is applied to the memory cell, with the programming voltage applied to the gate the selected memory cell is programmed to store a "0" value.

In the read mode, signal PE_ is a logic "1" level to turn transistor 66 off and inhibit programming. Signal CE is a logic "1" level to turn transistor 80 off and signal SADEF is a logic "0" level enabling the bias circuit made up of transistors 70, 72, 74, 76 and 78 to bias line 30. As a result, transistor 82 is saturated to set gate to source voltages for transistors 84, 86, 88, 90. If the selected memory cell coupled to line 30 stores a "1" value, it will be conductive and current will flow on line 30. Transistors 84, 86, 88 and 90 act as a current mirror to provide approximately four times the current on line 30 to a node S. A reference circuit made up of transistors 98, 100, 92, 94 and 96 is unable to conduct all of the current from transistors 84, 86, 88 and 90 causing node S to go high. Inverters 102 and 104 will then produce a sense amp output signal SAOUT having a logic "1" level. If the selected memory cell coupled to line 30 stores a "0" value, it will be nonconductive and no current will flow on line 30. Transistors 92, 94 and 96 will then pull node S low and inverters 102 and 104 will produce a signal SAOUT having a logic "0" level.

The "1" margin of an erased memory cell is defined as the lowest Vcc value which equals the control gate voltage such that the $I_{DS}$ of the selected cell is greater than the reference current divided by the effective product. The "0" margin of a programmed memory cell is defined as the highest Vcc value which equals the control gate voltage such that the $I_{DS}$ of the selected cell is sufficiently less than the reference current divided by the effective product. Improvement in the margin, both for ones at low control gate voltage Vcc and for zeros at high control gate voltage Vcc, will take place if the reduction in drain-source current of the reference cell, as voltage Vcc is lowered, occurs at a faster rate than the reduction in drain-source current of the selected cell. This is accomplished by forming the channel length of the reference cell to be greater than the channel length of the selected cells. The longer relative channel length reduces the drain-source current of the reference cell because of the reduction in the width-to-length ratio along with the increase of the threshold voltage Vt. The threshold voltage Vt increases because the memory cell is a short channel device and because the voltage threshold Vt of short channel devices increases as channel length is increased. The channel length of the reference cell may be increased up to thirty percent longer than the channel length of the selected cell.

As the control gate voltage Vcc is lowered, both reference and selected memory cells', drain-source currents decrease. However, the drain source current of the reference cell decreases at a faster rate because the Vgs−Vt is decreasing at a faster rate. The width-to-length change will not affect the rates of drain-source current change. At higher control gate voltage Vcc, the Vgs−Vt differences for both the reference cell and the selected cell become very small, so that only the width-to-length ratio differences dominate any drain-source current differences.

Figure 5:
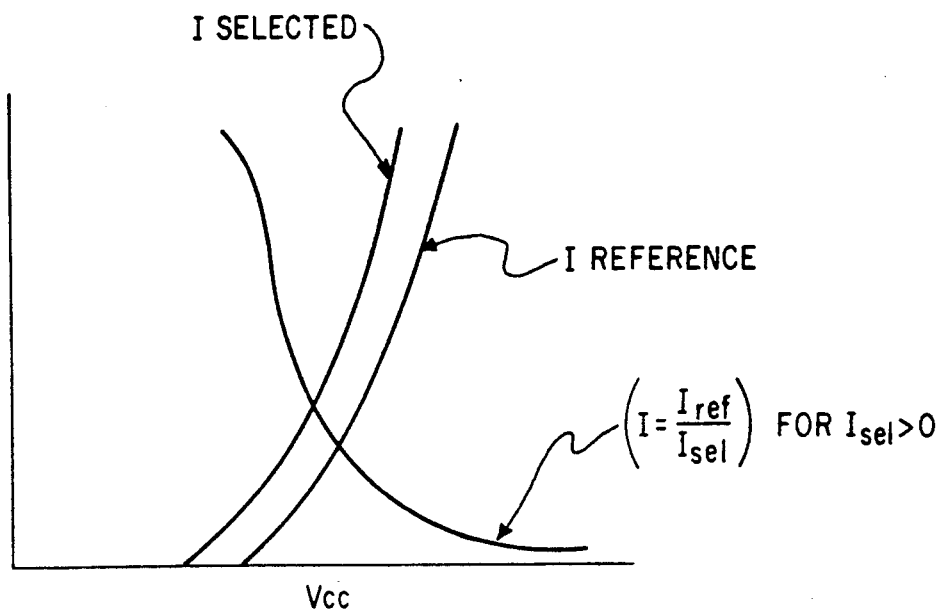
FIG. 5 is a graphic plot of drain-source current changes as a function of voltage Vcc according to one embodiment of the invention.

FIG. 5 shows a possible plot of drain-source current changes as a function of voltage Vcc.

Figure 6:
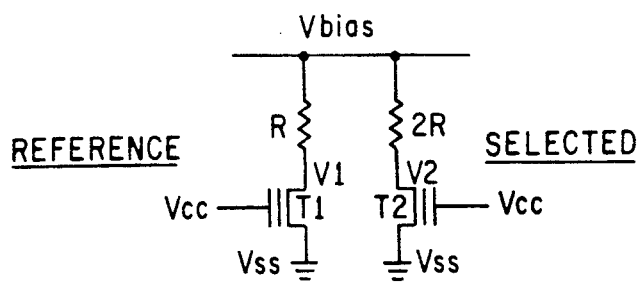
FIG. 6 is an electrical schematic diagram of another embodiment of the invention.

In an alternative embodiment of the invention, shown in FIG. 6, a current-to-voltage translator is used instead of a PMOS current mirror. When selected memory cell T2 is erased and conducting (a "one"), voltage V2 will be lower than voltage V1 because reference memory cell T1 is always conducting (always erased) and because R is less resistance than 2R by a factor of two. If selected memory cell T2 is programmed and not conducting (a "zero"), voltage V2 will be equal to Vbias which is higher than voltage V1 because reference memory cell T1 is always conducting. Therefore, the two states are defined. If V2 is less than V1, then the selected memory cell T2 is erased, or a "one". If V2 is greater than V1, then the selected memory cell T2 is programmed, or a "zero". However, -as control gate voltage Vcc is raised to a value sufficiently above the voltage threshold V+ of a programmed selected cell T2, voltage V2 will be lower than voltage V1 because the current through selected cell T2 may be raised to at least half of the current through reference cell T1. At this point a "zero" is read erroneously as a "one".

The channel length of the reference memory cell T1 is extended to be greater than the channel length of the selected cells in the length and manner previously discussed. The longer relative channel length reduces the drain-source current of the reference cell because of the reduction in the width-to-length ratio along with the increase of the threshold voltage Vt. The threshold voltage Vt increases because the memory cell is a short channel device and because the voltage threshold Vt of short channel devices increases as the channel length is increased.

To summarize the effect, an increased channel length in the reference cell will benefit reading ones at low control gate voltage Vcc without degrading zeros at high control gate voltage Vcc, when compared to other schemes that have no inherent benefit at low control gate voltage Vcc and no degradation at high control gate voltage Vcc.

Accordingly, while this invention has been described with reference to illustrative embodiments, this description is not intended to be construed in a limiting sense. Various modifications of the illustrative embodiments, as well as other embodiments of the invention, will be apparent to persons skilled in the art upon reference to this description. It is therefore contemplated that the appended claims will cover any such modifications or embodiments as fall within the true scope of the invention.

What is claimed:

1. A device for improving the sense margin of non-volatile memories, comprising:
   an array of rows and columns of floating gate memory cells; and
   a sense amplifier responsive to said array, said sense amplifier having an unprogrammed reference memory cell with a longer channel length and a higher threshold voltage than that of a selected memory cell of said array.

2. A device according to claim 1, wherein said channel length of said reference memory cell is up to 100 percent longer than the channel length of said selected memory cell.

3. A device for improving the sense margin of non-volatile memories, comprising:
   an array of rows and column of floating gate memory cells; each cell having a source-to-drain path, a control gate and a floating gate; the control gates of all cells in each row being connected to a wordline; one end of the source-to-drain path of each cell in each column being connected to a column line and the other end being connected to a ground line whereby a continuous series path of said source-to-drain paths is provided for all cells in a row; means for selectively applying logic voltages to said lines for read operations and for selectively applying programming voltages to said lines for program operations; and a sense amplifier responsive to said array, said sense amplifier having an unprogrammed reference memory cell with a longer channel length and a higher threshold voltage than that of a selected memory cell of said array.

4. A device according to claim 3, wherein said channel length of said reference memory cell is up to 100 percent longer than the channel length of said selected memory cell.

5. A method of improving the sense margin of non-volatile memories, comprising the steps of:
   forming an array of rows and columns of floating gate memory cells;
   forming a sense amplifier for each of said columns of floating gate memory cells; and
   forming the channel length of an unprogrammed reference memory cell in said sense amplifier to be longer than the channel length of a selected memory cell in said array, said unprogrammed reference memory cell having a higher threshold voltage than that of said selected memory cell.

6. A method according to claim 5, wherein said channel length of said reference memory cell is up to 100 percent longer than the channel length of said selected memory cell of said memory array.

* * * * *